(12) United States Patent
Suzuki et al.

(10) Patent No.: US 6,942,756 B2
(45) Date of Patent: Sep. 13, 2005

(54) FLUORORESIN FIBER PAPER, COPPER-CLAD LAMINATE FOR PRINTED BOARD USING THE SAME AND PRODUCTION PROCESS THEREOF

(75) Inventors: Takanori Suzuki, Shizuoka (JP); Hajime Tsuda, Shizuoka (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 116 days.

(21) Appl. No.: 10/207,890

(22) Filed: Jul. 31, 2002

(65) Prior Publication Data

US 2003/0024666 A1 Feb. 6, 2003

(30) Foreign Application Priority Data

Aug. 2, 2001 (JP) .................................... 2001-234365

(51) Int. Cl.$^7$ ..................... D21H 13/12; D21H 27/12
(52) U.S. Cl. .................... 162/136; 162/145; 162/146; 162/157.5; 162/192
(58) Field of Search ........................... 162/146, 157.5, 162/135, 136, 192

(56) References Cited

U.S. PATENT DOCUMENTS

| | | | | |
|---|---|---|---|---|
| 3,003,912 A | * | 10/1961 | Harford | 162/157.5 |
| 3,015,604 A | * | 1/1962 | Hochberg | 162/157.5 |
| 3,186,897 A | * | 6/1965 | Hochberg | 442/409 |
| 3,960,651 A | * | 6/1976 | Kometani et al. | 162/105 |
| 4,133,927 A | * | 1/1979 | Tomoda et al. | 428/215 |
| 5,470,409 A | * | 11/1995 | Deakyne et al. | 156/62.4 |
| 5,506,052 A | * | 4/1996 | Deakyne et al. | 428/363 |

* cited by examiner

Primary Examiner—Peter Chin
(74) Attorney, Agent, or Firm—McDermott Will & Emery LLP

(57) ABSTRACT

The invention provides fluororesin fiber paper excellent in adhesion to a copper foil, heat resistance, chemical resistance, low water absorption and electric insulation and capable of being used as a substrate of a printed board suitable for use in high frequency, of which a low dielectric loss is required. The fluororesin fiber paper is a porous sheet obtained by forming a slurry comprising fluororesin fiber into a sheet by a wet paper making method and sintering the resultant sheet and has an average pore diameter of 0.5 to 50 $\mu$m and a maximum pore diameter of at most 250 $\mu$m. A copper-clad laminate for printed board is produced by laminating the fluororesin fiber paper and a copper foil having a ten point mean height of surface roughness profile (Rz) of 0.5 to 8.0 $\mu$m on each other by means of vacuum hot pressing.

7 Claims, No Drawings

FLUORORESIN FIBER PAPER, COPPER-CLAD LAMINATE FOR PRINTED BOARD USING THE SAME AND PRODUCTION PROCESS THEREOF

BACKGROUND OF THE INVENTION

1. Field of the Invention

The present invention relates to fluororesin fiber paper excellent in heat resistance, chemical resistance, low water absorption and electric insulation, and extremely high in adhesion to copper foils when a copper-clad laminate is produced by vacuum hot pressing with the copper foils, and also relates to a copper-clad laminate for printed board obtained by laminating the fluororesin fiber paper with the copper foils by vacuum hot pressing and a production process thereof.

2. Description of the Related Arts

A copper-clad printed board corresponding with high frequency is first required to have a low dielectric loss, and a sheet made from a fluororesin has been preferably used. For example, a sheet obtained by impregnating a glass cloth with a fluororesin dispersion and sintering the impregnated cloth, a fluororesin film, fluororesin fiber paper, etc. have been used. As the sheet obtained by impregnating the glass cloth with the fluororesin dispersion and sintering the impregnated cloth, for example, the following sheet as disclosed in Japanese Patent Application Laid-Open No. 323501/1995 has been known. Namely, a glass cloth is used as a substrate, this substrate is impregnated with a dispersion of a polytetrafluoroethylene (hereinafter referred to as "PTFE") resin, and the impregnated substrate is sintered. This process is repeated several times to produce a sheet. The sheet thus obtained is laid on top of a copper foil, and they are integrally hot-pressed to provide a base material. When a plurality of such sheets as described above are laid on top of each other to form a base material, a layer of tetrafluoroethylene/perfluoroalkyl vinyl ether copolymer resin or tetrafluoroethylene/hexafluoropropylene copolymer resin is interposed as a film or coated layer between the respective sheets, and the same resin layer as described above is also interposed between a copper foil arranged as the outermost layer and the sheet. The respective sheets and copper foil thus laminated are integrally hot-pressed to provide a base material. A base material having a dielectric constant of 2 to 3.5 and a dielectric loss of about 0.0010 is produced by such a process.

However, this base material makes a difference in dimensional change between the longitudinal(X) and cross (Y) directions thereof, causes strain upon formation of a conductive layer of a circuit pattern or a heat treatment due to a difference in residual tension between warp and weft in the glass cloth and, in some cases, may undergo a great dimensional changes due to slippage or movement between glass fibers at stitch portions of the glass cloth. In addition, fine irregularities due to stitch are present on the surface of the base material. By these facts, the accuracy of formation of a pattern and through-holes is lowered, and a conductive part is expanded or contracted to cause damage. Accordingly, the above-described printed board involves a problem that it is lacking in the reliability of performance in a small-sized printed wiring board.

In addition, the conventional printed wiring board of fluororesin using the glass cloth is unequal in dielectric constant and dielectric loss at each portions due to difference in material structure between each portions, because the glass cloth has a stitch structure. More specifically, dielectric constant and dielectric loss vary according to whether the portion of the printed wiring board right under a portion of a circuit on the printed wiring board is an opening portion, a glass fiber portion or an intersection between warp and weft. Therefore, the printed wiring board involves a problem that properties of a high-frequency filter and the like provided on the printed wiring board are unstable. The problem by the unevenness due to the stitch structure also arises in the thickness-wise (Z) direction of the printed wiring board. For example, not only a plating layer of through-holes may not be uniformly formed, but also the plating layer may be lost at a portion where the fluororesin is present in plenty.

In addition, the printed wiring board also involves a problem that fine voids remain at an interface between the glass cloth and the PTFE layer, and so an etching liquid is easy to penetrate into the voids, the percentage of water absorption becomes high, and moisture in the air is easy to be taken in, and thus the dielectric constant and dielectric loss become high.

Japanese Patent Application Laid-Open No. 218690/1991 discloses that a sheet made by mixing polytetrafluoroethylene fiber with inorganic fiber and subjecting the mixture to wet paper making is sintered to obtain a substrate sheet for printed wiring board. When the sheet obtained by the wet paper making is used in a printed wiring board, the resulting printed wiring board does not involve the problem of scatter of dielectric properties at portions like the case of the glass cloth type because the sheet is even in the distribution of the fiber. However, the sheet is low in adhesion to a copper foil and hence has involved a problem from the viewpoint of practical use.

In any above case, adhesion of the sheet to the copper foil is low, and such sheets involve a problem from the viewpoint of practical use. Therefore, it is attempted to use an electrolytic copper foil great in surface roughness to enhance the adhesion. However, since an electric current of an information transmission signal flows through an interface between the copper foil and the substrate sheet as frequency becomes high, a transmission distance becomes longer as the surface roughness of the copper foil is greater. As a result, a transmission speed becomes slow. Therefore, it has been necessary to use a copper foil small in surface roughness. There is thus a strong demand for development of a fluororesin sheet high in adhesion even when it is laminated with copper foils small in surface roughness.

SUMMARY OF THE INVENTION

It is an object of the present invention to provide fluororesin fiber paper excellent in adhesion to a copper foil, heat resistance, chemical resistance, low water absorption and electric insulation and capable of being used as a substrate of a printed board suitable for use in high frequency, of which a low dielectric loss is required.

Another object of the present invention is to provide a copper-clad laminate making use of the fluororesin fiber paper and a production process thereof.

The present inventors have carried out various investigations with a view toward solving the above-described problems. As a result, it has been found that in order to ensure the adhesion of a fluororesin sheet to a copper foil, the fluororesin sheet is required to have a porous structure, and the relationship between the average pore diameter and maximum pore diameter of the fluororesin sheet and the surface roughness of the copper foil is important. The reason for it is considered to reside in that there is room where the fluororesin properly flows upon vacuum hot pressing, whereby the strong adhesion to the copper foil is feasible. More specifically, it has been found that the problems can be solved by adjusting the average pore diameter and maximum pore diameter of fluororesin fiber paper composed of fluororesin fiber alone or fluororesin fiber paper comprising inorganic fiber and/or inorganic fine particles so as to fall within ranges of 0.5 to 50 μm and at most 250 μm, respectively, in a wet paper making step and a sintering step, and laminating such paper with a copper foil having a ten point mean height of surface roughness profile (Rz) of 0.5 to 8.0 μm by means of vacuum hot pressing. It has also been found that the surface of the fluororesin fiber paper is subjected to surface modification, whereby a copper-clad laminate for high frequency far excellent in adhesion can be provided even when a rolled copper foil smaller in surface roughness is used.

According to the present invention, there is thus provided fluororesin fiber paper which is composed of a porous sheet obtained by forming a slurry comprising fluororesin fiber into a sheet by a wet paper making method and sintering the resultant sheet and has an average pore diameter of 0.5 to 50 μm and a maximum pore diameter of at most 250 μm. The term "sintering" means the process of melting the fluororesin with heat and, at the same time, removing impurities such as matrix resin, etc. by thermal decomposition.

According to the present invention, there is also provided a copper-clad laminate of fluororesin for printed board obtained by laminating copper foils having a ten point mean height of surface roughness profile (Rz) of 0.5 to 8.0 μm on one side or both sides of the fluororesin fiber paper described above by means of vacuum hot pressing.

According to the present invention, there is further provided a process for producing a copper-clad laminate of fluororesin for printed board, comprising a step of forming a slurry of fluororesin fiber alone or a mixed slurry of fluororesin fiber and inorganic fiber and/or inorganic fine particles into a sheet by a wet paper making method, a step of sintering the resultant sheet into fluororesin fiber paper having an average pore diameter of 0.5 to 50 μm and a maximum pore diameter of at most 250 μm and a step of laminating a copper foil having a ten point mean height of surface roughness profile (Rz) of 0.5 to 8.0 μm on one side or both sides of the fluororesin fiber paper by means of vacuum hot pressing.

According to the present invention, there is still further provided a process for producing a copper-clad laminate of fluororesin for printed board, comprising a step of forming a slurry of fluororesin fiber alone or a mixed slurry of fluororesin fiber and inorganic fiber and/or inorganic fine particles into a sheet by a wet paper making method, a step of sintering the resultant sheet into fluorocarbon resin fiber paper having an average pore diameter of 0.5 to 50 μm and a maximum pore diameter of at most 250 μm, a step of subjecting the fluororesin fiber paper to a plasma treatment and then to a coupling treatment with an imidazolesilane solution and a step of laminating a copper foil having a ten point mean height of surface roughness profile (Rz) of 0.5 to 8.0 μm on one side or both sides of the fluororesin fiber paper thus treated by means of vacuum hot pressing.

DETAILED DESCRIPTION OF THE PREFERRED EMBODIMENTS

The fluororesin fiber paper according to the present invention will be first described. The fluororesin fiber paper according to the first embodiment of the present invention is composed of a porous sheet obtained by forming a slurry of fluororesin fiber into a sheet by a wet paper making method and sintering the resultant sheet and having an average pore diameter of 0.5 to 50 μm and a maximum pore diameter of at most 250 μm.

The fluororesin fiber paper according to the second embodiment of the present invention is composed of a porous sheet obtained by forming a mixed slurry of fluororesin fiber and inorganic fiber into a sheet by a wet paper making method and sintering the resultant sheet and having an average pore diameter of 0.5 to 50 μm and a maximum pore diameter of at most 250 μm.

The fluororesin fiber paper according to the third embodiment of the present invention is composed of a porous sheet obtained by forming a mixed slurry containing fluororesin fiber and inorganic fine particles into a sheet by a wet paper making method and sintering the resultant sheet and having an average pore diameter of 0.5 to 50 μm and a maximum pore diameter of at most 250 μm.

The fluororesin fiber paper according to the fourth embodiment of the present invention is composed of a porous sheet obtained by forming a slurry containing fluororesin fiber, inorganic fiber and inorganic fine particles into a sheet by a wet paper making method and sintering the resultant sheet and having an average pore diameter of 0.5 to 50 μm and a maximum pore diameter of at most 250 μm.

In the fluororesin fiber paper according to the first to fourth embodiments of the present invention, the fluororesin fiber is preferably polytetrafluoroethylene fiber. In the fluororesin fiber paper according to the second and fourth embodiments of the present invention, the inorganic fiber is preferably glass fiber. In the fluororesin fiber paper according to the third and fourth embodiments of the present invention, the inorganic fine particles are preferably titanium ceramics. In the fluororesin fiber paper according to the first to fourth embodiments of the present invention, the surfaces thereof may be subjected to a plasma treatment and then to a coupling treatment with an imidazolesilane.

The production process of the fluororesin fiber paper for printed board according to the present invention will be then described. Examples of the fluororesin fibers used in the present invention include fibers of fluorine-containing resins such as polytetrafluoroethylene (PTFE), tetrafluoroethylene/perfluoroalkyl vinyl ether copolymer (PFA), tetrafluoroethylene/hexafluoropropylene/perfluoroalkyl vinyl ether terpolymer, tetrafluoroethylene/hexafluoropropylene copolymer (FEP), polychlorotrifluoroethylene (PCTFE), ethylene/tetrafluoroethylene copolymer (ETFE), ethylene/chlorotrifluoroethylene copolymer (ECTFE), polyvinylidene fluoride (PVDF) and polyvinyl fluoride. The above-mentioned fluororesin fibers may be used either singly or in any combination thereof according to the application field of the resulting copper-clad laminate.

Among the fluororesin fibers, PTFE fiber is preferred for obtaining the fluororesin fiber paper and printed wiring boards of fluororesin according to the present invention because it is low in dielectric constant and dielectric loss and excellent in heat resistance and chemical resistance.

No particular limitation is imposed on the diameter and fiber length of the fluororesin fiber used in the present invention so far as the fiber can be formed into a sheet by the wet paper making method. For example, fiber having a diameter of 1 to 50 μm and a length of 0.1 to 10 mm may be used. No particular limitation is also imposed on the form thereof, and fiber in any of various forms of simple fiber, granule (spherical, indefinite, etc.), fibrid, wood pulp and the like may be used. If the diameter and length are smaller than the lower limits of the above-described respective ranges, such fiber is poor in drainability upon paper making, and the productivity is lowered. If the diameter and length exceed the respective upper limits, it is difficult to form a thin sheet. Therefore, fibers within the above ranges are preferred.

In the present invention, with respect to the form of the fluororesin fiber, fibrillated fiber or unfibrillated fiber is selected for use as the fluororesin fiber according to properties required of the fluororesin fiber paper, specifically, sheet strength, dimensional stability and the like, and the content or the like of inorganic fiber and/or the inorganic fine particles. They may be used in combination, if necessary.

The degree of fibrillation is determined by the relationship among the average pore diameter, maximum pore diameter, sheet strength, etc. of the fluororesin fiber paper formed. For example, in the case where higher sheet strength is required, fiber enhanced in the degree of fibrillation may preferably be used. The adhesion of the fluororesin fiber to other materials is also improved thereby.

The degree of fibrillation can be expressed by the freeness prescribed in JIS P 8121-1995.

As a means for the fibrillation, may be used a general beating machine, such as a ball mill, beater, Lampen mill, PFI mill, SDR (single disk refiner), DDR (double disk refiner), or any other refiner.

An example of the PTFE fiber used in the present invention includes stretched or unstretched fiber obtained by dispersing fine PTFE particles in a matrix of a hydrophilic binder such as viscose, carboxymethyl cellulose or polyvinylalcohol and spinning the dispersion from an orifice to a coagulation bath. In this case, the resultant stretched or unstretched PTFE fiber is chopped into lengths of 3 to 15 mm and dispersed in water together with the inorganic fine particles, inorganic fiber and/or other materials using a dispersing agent such as polyacrylamide to prepare a paper stuff. This paper stuff is formed into paper by means of a cylinder paper machine, Fourdrinier paper machine, short wire type or inclined wire type paper machine to form a primary sheet of the PTFE fiber. In the formation of the primary sheet of the PTFE fiber, the matrix substance incorporated into the PTFE fiber exhibits a binding function between fibers upon the paper making.

In the present invention, inorganic fiber such as glass fiber, silica fiber, alumina fiber or aluminum silicate fiber is blended into the paper stuff for the purpose of imparting thermal dimensional stability to the resulting copper-clad laminate. The preferable blending amount is not greater than 30% by weight based on the total weight of the fluororesin fiber, inorganic fiber and inorganic fine particles. If the amount of the inorganic fiber blended exceeds 30% by weight, the strength of the resulting fluororesin fiber paper is lowered. With respect to the kind of the inorganic fiber, glass fiber is preferred because the objects of the present invention can be fully achieved, and its price is cheap.

In the fluororesin fiber paper according to the present invention, inorganic fine particles may be contained as needed. Examples of the inorganic fine particles include fine particles of titanium dioxide ceramics, barium titanate ceramics, lead titanate ceramics, strontium titanate ceramics, calcium titanate ceramics, bismuth titanate ceramics, magnesium titanate ceramics and lead zirconate ceramics. These may be used either singly or in any combination thereof. The ceramics, for example, titanium dioxide ceramics, mean a system containing titanium dioxide alone and systems containing titanium dioxide and a small amount of additives, in which the crystal structure of titanium dioxide as a main component is retained. The same shall apply to the ceramics of other systems.

No particular limitation is imposed on the form and dimension of the inorganic fine particles used in the present invention so far as the primary sheet can be formed by the wet paper making method. The forms thereof include spherical, hollow, fibrous, special odd-shaped, indefinite and other various forms. However, for example, spherical particles are generally used, and the particle diameter thereof is preferably not greater than 50 $\mu$m, or within a range of more preferably 0.1 to 20 $\mu$m, still more preferably 0.1 to 15 $\mu$m. If the particle diameter of the inorganic fine particles is too great, it is hard to uniformly disperse them in a slurry for paper making, and they are easy to unevenly distribute in the resulting primary sheet of the fluororesin fiber. If the particle diameter is too small on the other hand, the handling property thereof becomes poor, their yield in the primary sheet upon wet paper making decreases, and their content in the primary sheet is hard to be controlled.

The kind and amount of the inorganic fine particles blended into the fluororesin fiber paper are specifically determined according to the properties required of the resulting printed board. For example, in the case where a photo-catalytic function is required, titanium dioxide ceramics are used. In the case where a high dielectric constant is required, strontium titanate ceramics are used. The preferable blending amount of the inorganic fine particles is not greater than 70% by weight based on the total weight of the fluororesin fiber, inorganic fiber and inorganic fine particles. If the amount of the inorganic fine particles blended exceeds 70% by weight, the strength of the resulting fluororesin fiber paper becomes weak, their yield upon wet paper making is lowered, and they are easy to be separated from the surface of the resulting fluororesin fiber paper. The kind and amount of the inorganic fine particles added are determined according to the properties required of the printed board made of the fluororesin fiber paper formed as described above.

In the present invention, heat-resistant insulating fiber may also be added for the purpose of more improving the dimensional stability of the resulting printed wiring board. As the heat-resistant insulating fiber, may be used poly(p-phenylene benzobisoxazole) fiber, aromatic polyester fiber, polyphenylene sulfide fiber or aromatic polyamide fiber. By addition of the heat-resistant insulating fiber, the sheet strength of the resulting fluororesin fiber paper can be improved, and higher heat resistance can also be imparted. In addition, coefficients of thermal expansion in the plane direction (hereinafter referred to as "XY direction") and thickness-wise direction (hereinafter referred to as "Z direction") of the resulting printed board can be reduced, and mechanical strength of the printed board, such as bending strength and bending elastic modulus, can be improved, and moreover the dielectric constant may also be controlled by adjusting the blending amount thereof.

The heat-resistant insulating fiber may also be used in a fibrillated form. Entanglement between fibers is strengthened thereby, and the sheet strength is more improved. In addition, since such fibrillated fiber is easy to hold the inorganic fine particles, it can contribute to increase in the content and improvement in yield of the inorganic fine particles. As a means for the fibrillation, may be used a general beating machine, such as a ball mill, beater, Lampen mill, PFI mill, SDR (single disk refiner), DDR (double disk refiner), or any other refiner.

The degree of fibrillation is determined by the relationship among the average pore diameter, maximum pore diameter and sheet strength of the resulting fluororesin fiber paper. In the case where small pore diameter and higher sheet strength are required, fiber enhanced in the degree of fibrillation may preferably be used.

No particular limitation is imposed on the form of the heat-resistant insulating fiber. However, the diameter is preferably not greater than 50 μm, and the length is preferably 0.1 to 20 mm. If the diameter is greater than 50 μm, it is difficult to form a thin sheet. If the length is shorter than 0.1 mm, the effect of the dimensional stability is hard to exhibit. If the length is longer than 20 mm, such fiber is hard to be uniformly dispersed.

In order to produce the fluororesin fiber paper according to the present invention, the wet paper making method used in ordinary paper making is used. More specifically, a slurry obtained by stirring and mixing a prescribed amount of the fluororesin fiber in water and preferably adjusting the solid concentration thereof to 0.5% or lower is subjected to a wet paper machine such as a Fourdrinier paper machine or cylinder paper machine, and drained on a drainage part in the form of a continuous wire mesh to obtain a paper-like porous sheet.

When the inorganic fine particles are contained, the inorganic fine particles may preferably be subjected to the following pretreatment for the purpose of preventing them from being washed away upon wet paper making. Namely, a prescribed amount of the inorganic fine particles is weighed and stirred in water together with a flocculant to flocculate them. The flocculated particles and a prescribed amount of the fluororesin fiber are stirred and mixed in water to prepare a slurry.

As the flocculant used in the present invention, may be used a general flocculant employed in ordinary paper making and a flocculating treatment of industrial waste water or living waste water. Specific examples thereof include aluminum sulfate, polyaluminum chloride, ferric chloride, polyferric sulfate, ferrous sulfate, dimethyldiallylammonium chloride, alkylamine-epichlorohydrin condensates, ethylimine, alkylene dichloride-polyalkylene polyamine condensates, dicyanediamide-formalin condensates, polyacrylamides, sodium polyacrylate, poly(meth)acrylic aminoalkyl esters, Mannich modified products of polyacrylamide, chitosan, and other inorganic, organic and polymeric flocculants. A suitable flocculant may be chosen for use according to the kind of the inorganic fine particles contained in the fluororesin fiber.

In order to enhance the flocculating effect on the inorganic fine particles to improve the yield of the inorganic fine particles, it is preferred that an inorganic flocculant be used in combination with an organic or polymeric flocculant, and that a synthetic mucilaginous agent such as polyacrylamide type or polyethylene oxide type be added. The amount of the flocculant added can be determined according to the flocculated condition of the inorganic fine particles.

Additives such as various kinds of paper-strength additives, dispersing agents, antifoaming agents and fillers, which are used in ordinary paper making, may be incorporated into the fluororesin fiber paper sheets according to the present invention. The thickness and basis weight of the fluororesin fiber paper in the present invention are 50 to 2000 μm and 30 to 1500 g/m$^2$, respectively, and proper thickness and basis weight are determined according to the use application thereof.

The fluororesin fiber paper of the present invention obtained in such a manner has excellent features that the inorganic fiber and/or inorganic fine particles can be uniformly contained compared with a dry method used in the production of a nonwoven fabric, and the formation is uniform.

The fluororesin fiber sheet obtained in the above-described manner is then sintered in an electric oven. By the sintering, fusion bonding occurs between the fluororesin fibers, between the fluororesin fiber and the inorganic fiber and between the fluororesin fiber and the inorganic fine particles, simultaneously with removal of the binder matrix resin in the fluororesin fiber by thermal decomposition.

In the fluororesin fiber paper after the sintering, it is necessary that the average pore diameter thereof be 0.5 to 50 μm, the maximum pore diameter thereof be at most 250 μm. If the average pore diameter is smaller than 0.5 μm, the adhesion of such paper to a copper foil is insufficient. If the average pore diameter is greater than 50 μm, portions not adhering to a copper foil are produced in such fluororesin fiber paper. If the maximum pore diameter is greater than 250 μm, such fluororesin fiber paper does not clearly adhere to a copper foil. Therefore, such a great maximum pore diameter must be avoided.

The fluororesin fiber paper according to the present invention may also be subjected to a plasma treatment and then to a coupling treatment with imidazolesilane. These treatments are performed by a step of subjecting the surface of the fluororesin fiber paper obtained by sintering the fluororesin fiber porous sheet formed by the wet paper making method to a plasma treatment and a coupling treatment. These steps will hereinafter be described.

In the present invention, the plasma treatment is performed by a very common apparatus. A gas for plasma treatment is at least one selected from oxygen gas, nitrogen gas, hydrogen gas, dry air, argon gas, helium gas, ammonia gas, nitrogen monoxide gas, nitrogen dioxide gas, carbon monoxide gas and carbon dioxide gas.

In the present invention, defluorination is caused on the surface of the fluororesin fiber paper, which is a porous sheet, by conducting the plasma treatment to generate a radical. When such a site is exposed to air, the radical reacts with water in air to form a carboxyl group and a hydroxyl group, whereby the effect of the coupling treatment with the silane coupling agent in the subsequent step can be enhanced.

In the present invention, the coupling treatment is performed by immersing the surface of the fluororesin fiber paper subjected to the plasma treatment in a deaerated imidazolesilane/methanol solution.

Imidazolesilane has the following features. Since the imidazole group contained in imidazolesilane forms a coordinate bond with a metal, adhesive force at an interface of a composite material of a metal and an organic substance such as polymer, etc. is enhanced, and a rust preventive effect on copper or copper alloys is exhibited. Imidazolesilane is diluted with methanol adjusted to a pH of about 5 in advance so as to give a concentration of 1 to 50% by weight. In this case, ethanol may be used as the solvent in addition to methanol. Besides, solvents compatible with imidazolesilane, such as butanol and 2-butoxyethanol, may also be used without any particular limitation.

In order to penetrate imidazolesilane into the surface of the porous sheet, an immersion method is used to immerse the porous sheet subjected to the plasma treatment for 1 minute in the dilute solution of imidazolesilane in methanol. After the porous sheet is taken out of the solution, it is dried at 110° C. for 90 minutes, and a coupling reaction is allowed to progress by dehydration under heating. Thereafter, unreacted imidazolesilane is washed out with methanol using an ultrasonic washer or the like, and the porous sheet is dried again to provide surface-modified fluororesin fiber paper.

The copper-clad laminate of fluororesin for printed board according to the present invention is produced by laminating a copper foil on one side or both sides of the porous fluororesin fiber paper obtained in the above-described manner. The laminating of the porous fluororesin fiber paper with the copper foil is performed in the following manner.

Copper foils are arranged on both sides (or one side if necessary) of the fluororesin fiber paper, the pore diameter of which has been controlled, or to which the surface treatment has been subjected. When PTFE is used as the fluororesin, a heating and pressing treatment can be performed for 90 minutes by means of a vacuum press under conditions of a temperature not lower than the melting point: 327° C. thereof, for example, 380° C. and a pressure of 1 MPa to provide a double-sided copper-clad laminate for printed board integrally formed. Even in the case of other fluororesins, the laminating may be performed in accordance with this process.

The copper foil used in the present invention is required to have a ten point mean height of surface roughness profile (Rz) of 0.5 to 8.0 μm. If Rz is smaller than 0.5 μm, the adhesion to the fluororesin fiber paper is insufficient. If Rz exceeds 8.0 μm, a signal transmission speed of the resulting printed board becomes slow. (Rz is measured in accordance with JIS C 6515.)

The copper foil used in the present invention may be either an electrolytic copper foil or a rolled copper foil. However, the present invention is more effective for the rolled copper foil having a small Rz. In the present invention, the ten point mean height of surface roughness profile (Rz) means surface roughness of a surface subjected to a roughening treatment. The pitch of irregularities on the surface of the copper foil is preferably 0.1 to 10.0 μm. If the pitch is outside this range, the adhesion greatly varies at each portions. Copper foils having a thickness of about 9 to 35 μm can be used.

The fluororesin fiber paper according to the present invention is excellent in adhesion to the copper foil, heat resistance, chemical resistance, low water absorption and electric insulation and may be used as the substrate of printed boards suitable for use in high frequency, of which a low dielectric loss is required. The copper-clad laminate produced by using this fluororesin fiber paper is particularly suitable for use in wiring of an antenna part used in a high-frequency band in an information transmission instrument or the like, high-density wiring of a semiconductor such as an IC package and precision wiring of a small-sized instrument.

EXAMPLES

The present invention will hereinafter be described in more detail by the following Examples. However, the present invention is not limited to these examples.

Example 1

Unstretched PTFE fiber (trade name: Toyofulon, product of Toray Fine Chemicals Co., Ltd.; fiber diameter: 15 μm) obtained from a dispersion of PTFE powder using viscose as a matrix was chopped into lengths of 6 mm to prepare PTFE short fiber. The PTFE short fiber thus provided was then placed in a container in which water had been contained, and the contents were stirred by a reciprocating rotation type agitator to be uniformly dispersed. A prescribed amount of this stuff dispersion was taken out to make wet web by means of a standard sheet machine prescribed in JIS P 8222-1998. The wet web was then squeezed the water out by pressing and dried by means of a Yankee drier heated and controlled at 130° C. to obtain a primary sheet. This sheet was then put into an electric oven heated and controlled at 350° C. to subject it to a heat treatment (sintering) for 5 minutes, thereby conducting fusion bonding between the fluororesin fibers to obtain fluororesin fiber paper having a thickness of 400 μm, an average pore diameter of 20 μm and a maximum pore diameter of 150 μm.

A copper foil having a thickness of 18 μm and a ten point mean height of surface roughness profile (Rz) of 3.0 μm was arranged on both sides of the fluororesin fiber paper, and they were heated and pressed for 90 minutes by means of a vacuum press under conditions of 380° C. higher than the melting point: 327° C. of PTFE and a pressure of 1 MPa to form a double-sided copper-clad laminate integrally formed.

Example 2

The same PTFE short fiber as that used in Example 1 was provided. The PTFE short fiber thus provided and glass fiber (trade name: PDE1/8 ZA509, product of Unitika Glass Fiber Co., Ltd.; diameter: 6 μm; fiber length: 3 mm) were then placed in a container, in which water had been contained, in such a manner that a ratio of the PTFE fiber and the glass fiber was 80% by weight and 20% by weight, and the contents were stirred by a reciprocating rotation type agitator to be uniformly dispersed. A prescribed amount of this stuff dispersion was taken out and hereinafter treated in exactly the same manner as in Example 1 to obtain fluororesin fiber paper having a thickness of 400 μm, an average pore diameter of 19 μm and a maximum pore diameter of 145 μm.

The resultant fluororesin fiber paper was used to form a double-sided copper-clad laminate in the same manner as in Example 1.

Example 3

PTFE fiber (trade name: Toyofulon, product of Toray Fine Chemicals Co., Ltd.; fiber diameter: 35 μm) similar to that used in Example 1 was chopped into lengths of 6 mm to prepare PTFE short fiber. On the other hand, tetrafluoroethylene/perfluoroalkyl vinyl ether copolymer (PFA) fiber (trade name: Hastex, product of Toyo polymer Co., Ltd.; fiber diameter: 25 μm; fiber length: 5 mm) was beaten by means of a beater and adjusted to a freeness of 500 ml (as measured in accordance with JIS P 8121) to be provided. While stirring with a blade of a reciprocating rotation type agitator, fine particles of strontium titanate (trade name: ST-03", product of Sakai Chemical Industry Co., Ltd.; average particle diameter: 0.3 μm), an inorganic flocculant (trade name: Ryusan Bando, product of Nippon Light Metal Company, Ltd.) in an amount of 2.0% by weight based on the fine particles, a polymeric flocculant (trade name: Hiholder 109, product of Kurita Water Industries, Ltd.) in an amount of 1.0% by weight based on the fine particles and a synthetic mucilaginous agent (trade name: ACRYPERSE PMP, product of Diafloc Co., Ltd.) in an amount of 1.5% by weight based on the fine particles were added to a container, in which water had been contained, and the contents were stirred to flocculate the fine particles of strontium titanate. The stirring was stopped, and the PTFE fiber and beaten PFA fiber were added to the container in such a manner that a ratio of the PTFE fiber, the beaten PFA fiber and the fine particles of strontium titanate was 50% by weight, 10% by weight and 40% by weight, respectively, and the contents were stirred by the reciprocating rotation type agitator to be uniformly dispersed. A prescribed amount of this stuff dispersion was taken out and hereinafter treated in exactly the same manner as in Example 1 to obtain fluororesin fiber paper having a thickness of 400 µm, an average pore diameter of 35 µm and a maximum pore diameter of 80 µm.

The resultant fluororesin fiber paper was used to form a double-sided copper-clad laminate in the same manner as in Example 1.

Example 4

The same PTFE short fiber as that used in Example 1, the same glass fiber as that used in Example 2 and the same beaten PFA fiber as that used in Example 3 were provided. While stirring with a blade of a reciprocating rotation type agitator in the same manner as in Example 3, fine particles of strontium titanate (trade name: ST-03, product of Sakai Chemical Industry Co., Ltd.; average particle diameter: 0.3 µm), an inorganic flocculant (trade name: Ryusan Bando, product of Nippon Light Metal Company, Ltd.) in an amount of 2.0% by weight based on the fine particles, a polymeric flocculant (trade name: Hiholder 109, product of Kurita Water Industries, Ltd.) in an amount of 1.0% by weight based on the fine particles and a synthetic mucilaginous agent (trade name: ACRYPERSE PMP, product of Diafloc Co., Ltd.) in an amount of 1.5% by weight based on the fine particles were added to a container, in which water had been contained, and the contents were stirred to flocculate the fine particles of strontium titanate. The stirring was stopped, and the PTFE fiber, beaten PFA fiber and glass fiber were added to the container in such a manner that a ratio of the PTFE fiber, the beaten PFA fiber, the fine particles of strontium titanate and the glass fiber was 30% by weight, 10% by weight, 50% by weight and 10% by weight, respectively, and the contents were stirred by the reciprocating rotation type agitator to be uniformly dispersed. A prescribed amount of this stuff dispersion was taken out and hereinafter treated in exactly the same manner as in Example 1 to obtain fluororesin fiber paper having a thickness of 400 µm, an average pore diameter of 30 µm and a maximum pore diameter of 70 µm.

The resultant fluororesin fiber paper was used to form a double-sided copper-clad laminate in the same manner as in Example 1.

Example 5

The fluororesin fiber paper having a thickness of 400 µm, which had been produced in Example 1, was provided. The fluororesin fiber paper was first subjected to a plasma treatment with argon gas under conditions of a pressure of 13.3 Pa, RF output of 100 W and irradiation time of 20 seconds using a plane parallel plate electrode type plasma device. The fiber paper was then subjected to a silane coupling treatment. As the silane coupling agent, was used "Imidazolesilane IS-1000", (trade name, product of Japan Energy Corporation). After the sheet subjected to the plasma treatment was taken out in air once, the sheet was immersed in a 3 wt. % dilute solution of Imidazolesilane IS-1000 in methanol at room temperature. After the sheet was immersed for 1 minute, it was taken out from the solution and dried at 110° C. for 90 minutes to allow a coupling reaction to progress by dehydration. Thereafter, unreacted imidazolesilane was washed out with methanol using an ultrasonic washer, and the sheet was dried again to produce fluororesin fiber paper subjected to the coupling treatment. The average pore diameter and maximum pore diameter of the fluororesin fiber paper after the treatment were 18 µm and 140 µm, respectively.

The resultant fluororesin fiber paper was used to form a double-sided copper-clad laminate in the same manner as in Example 1.

Comparative Example 1

Unstretched PTFE fiber (trade name: Toyofulon, product of Toray Fine Chemicals Co., Ltd.; fiber diameter: 50 µm) was chopped into lengths of 6 mm to prepare PTFE short fiber in the same manner as in Example 1. This fiber was used to obtain fluororesin fiber paper having a thickness of 400 µm, an average pore diameter of 70 µm and a maximum pore diameter of 350 µm in the same manner as in Example 1.

The resultant fluororesin fiber paper was used to form a double-sided copper-clad laminate in the same manner as in Example 1.

Comparative Example 2

The same PTFE short fiber as that used in Example 1 was provided, and hereinafter treated in exactly the same manner as in Example 2 to obtain fluororesin fiber paper having a thickness of 400 µm, an average pore diameter of 60 µm and a maximum pore diameter of 300 µm.

The resultant fluororesin fiber paper was used to form a double-sided copper-clad laminate in the same manner as in Example 1.

Comparative Example 3

The same PTFE short fiber as that used in Example 1 and the same beaten PFA fiber as that used in Example 3 were provided, and hereinafter treated in exactly the same manner as in Example 3 to obtain fluororesin fiber paper having a thickness of 400 µm, an average pore diameter of 0.4 µm and a maximum pore diameter of 30 µm.

The resultant fluororesin fiber paper was used to form a double-sided copper-clad laminate in the same manner as in Example 1.

Comparative Example 4

The same PTFE short fiber as that used in Example 1 and the same beaten PFA fiber as that used in Example 3 were provided, and hereinafter treated in exactly the same manner as in Example 4 to obtain fluororesin fiber paper having a thickness of 400 µm, an average pore diameter of 0.1 µm and a maximum pore diameter of 20 µm.

The resultant fluororesin fiber paper was used to form a double-sided copper-clad laminate in the same manner as in Example 1.

Comparative Example 5

A copper foil having a thickness of 18 µm and a ten point mean height of surface roughness profile (Rz) of 10 µm was arranged on both sides of the fluororesin fiber paper obtained in Example 1 to obtain a double-sided copper-clad laminate in the same manner as in Example 1.

Comparative Example 6

A copper foil having a thickness of 18 µm and a ten point mean height of surface roughness profile (Rz) of 0.1 µm was arranged on both sides of the fluororesin fiber paper obtained in Example 1 to obtain a double-sided copper-clad laminate in the same manner as in Example 1.

In the present invention, the average pore diameter and maximum pore diameter of each fluororesin fiber paper, and the adhesion to a copper foil in each copper-clad laminate and ten point mean height of surface roughness profile (Rz) of the copper foil were determined in accordance with the following respective methods.

1) Measuring Method of Average Pore Diameter and Maximum Pore Diameter of Fluororesin Fiber Paper:

Measurement was conducted by means of an Automated Capillary Flow Porometer (trade name) manufactured by POROUS MATERIALS INC. in accordance with ASTM F316-86, F778 and B.S. 3321, 6410.

2) Measurement of Adhesion to Copper Foil (Peel-Strength):

Measurement was conducted in accordance with JIS C 6481.

The evaluation results of the fluororesin fiber paper sheets and copper-clad laminates obtained in the above-described Examples and Comparative Examples are shown in Table 1.

TABLE 1

|  | Average pore diameter ($\mu$m) | Maximum pore diameter ($\mu$m) | Adhesion to copper foil (N/15 mm) |
|---|---|---|---|
| Ex. 1 | 20 | 150 | 20 |
| Ex. 2 | 19 | 145 | 18 |
| Ex. 3 | 35 | 80 | 16 |
| Ex. 4 | 30 | 70 | 15 |
| Ex. 5 | 18 | 140 | At least 25 |
| Comp. Ex. 1 | 70 | 350 | 10 |
| Comp. Ex. 2 | 60 | 300 | 9 |
| Comp. Ex. 3 | 0.4 | 30 | 5 |
| Comp. Ex. 4 | 0.1 | 20 | 2 |
| Comp. Ex. 5 | 20 | 150 | 23 |
| Comp. Ex. 6 | 20 | 150 | 2 |

The following respects were confirmed from Table 1. Namely, the double-sided copper-clad laminates of Examples 1 to 4 produced from the fluororesin fiber paper whose average pore diameter and maximum pore diameter were adjusted to 1 to 50 $\mu$m and at most 250 $\mu$m, respectively, and the copper foil having an Rz of 0.5 to 8 $\mu$m achieve the necessary adhesion (15 N/15 mm) of the substrate to the copper foil. However, Comparative Examples 1 to 4 in which the average pore diameter and maximum pore diameter of the fluororesin fiber paper are outside the above respective ranges cannot achieve the necessary adhesion (15 N/15 mm) of the substrate to the copper foil.

In Comparative Example 5 in which Rz of the copper foil is greater than the upper limit of the above range, the adhesion was sufficient, but a signal transmission speed of the resultant printed board was slow.

In Comparative Example 6 in which Rz of the copper foil is smaller than the lower limit of the above range, the adhesion was extremely weak. Example 5 in which surface modification was conducted was strong in adhesion compared with Example 1 in which no surface modification was conducted, and so the effect of the surface modification was confirmed.

What is claimed is:

1. Fluororesin fiber paper which is composed of a porous sheet obtained by forming a slurry comprising fluororesin fiber and inorganic fine particles into a sheet by a wet paper making method and sintering the resultant sheet and has an average pore diameter of 0.5 to 50 $\mu$m and a maximum pore diameter of at most 250 $\mu$m.

2. The fluororesin fiber paper according to claim 1, wherein said slurry contains inorganic fiber.

3. The fluororesin fiber paper according to claim 1, wherein the fluororesin fiber is polytetrafluoroethylene fiber.

4. The fluororesin fiber paper according to claim 2, wherein the inorganic fiber is glass fiber.

5. The fluororesin fiber paper according to claim 1, wherein the inorganic fine particles are fine particles of titanium ceramics.

6. The fluororesin fiber paper according to claim 1, wherein the surface of the paper is subjected to a plasma treatment and then to a coupling treatment with imidazolesilane.

7. The fluororesin fiber paper according to claim 1, wherein the particle diameter of said inorganic fine particles is in a range of 0.1 to 20 $\mu$m.

* * * * *